United States Patent
Dupre et al.

(10) Patent No.: US 12,339,159 B2
(45) Date of Patent: Jun. 24, 2025

(54) FORCE SENSOR WITH TARGET ON SEMICONDUCTOR PACKAGE

(71) Applicant: Melexis Technologies SA, Bevaix (CH)

(72) Inventors: Nicolas Dupre, Bevaix (CH); Gael Close, Bevaix (CH); Theo Le Signor, Bevaix (CH); Tim Vangerven, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 255 days.

(21) Appl. No.: 17/850,566

(22) Filed: Jun. 27, 2022

(65) Prior Publication Data

US 2022/0412816 A1 Dec. 29, 2022

(30) Foreign Application Priority Data

Jun. 28, 2021 (EP) ..................... 21182116

(51) Int. Cl.
*G01L 1/12* (2006.01)
*G01G 7/02* (2006.01)
(Continued)

(52) U.S. Cl.
CPC .................. *G01G 7/02* (2013.01); *G01L 1/04* (2013.01); *G01L 1/122* (2013.01);
(Continued)

(58) Field of Classification Search
CPC ......... G01L 1/122; G01L 1/26; G01L 1/2293; G01L 1/2287; G01L 5/168; G01G 3/15; G01B 7/24
See application file for complete search history.

(56) References Cited

U.S. PATENT DOCUMENTS

| 7,388,574 B2* | 6/2008 | Takatsuka | G05G 9/047 345/161 |
| 7,663,362 B2* | 2/2010 | Kishida | G01R 33/04 73/862.391 |

(Continued)

FOREIGN PATENT DOCUMENTS

CN 112067170 A 12/2020

OTHER PUBLICATIONS

Search Report from corresponding European Application No. 21182116. 0, Dec. 20, 2021.

(Continued)

*Primary Examiner* — Tran M. Tran
(74) *Attorney, Agent, or Firm* — Workman Nydegger

(57) ABSTRACT

A force sensor has a sensing system including a target piece and a sensing element, configured to provide changes of a magnetic field, being generated by motion of the target piece. The sensing element senses these changes and provides a signal representative of the position of the target piece. An integrated circuit with processing means can process signals from the sensing element. A semiconductor package includes at least the integrated circuit. A flexible piece includes the target, and it is attached to the semiconductor package. The attachment area between the flexible piece and the semiconductor package does not extend beyond the top projection, or outline, of the semiconductor package. The flexible piece receives a force stimulus, so that upon exerting a force on the flexible piece, the displacement of the target piece with respect to the surface of the semiconductor package can be sensed by the sensing element.

13 Claims, 5 Drawing Sheets

(51) Int. Cl.
    *G01L 1/04*     (2006.01)
    *G01R 33/00*     (2006.01)
    *G01R 33/07*     (2006.01)
    *A47J 42/44*     (2006.01)

(52) U.S. Cl.
    CPC ....... *G01R 33/0047* (2013.01); *G01R 33/072* (2013.01); *A47J 42/44* (2013.01)

(56) References Cited

U.S. PATENT DOCUMENTS

| | | | | |
|---|---|---|---|---|
| 7,992,444 B2 * | 8/2011 | Takeuchi | ............. | G01R 33/072 |
| | | | | 73/728 |
| 8,499,651 B2 * | 8/2013 | Kishida | ................. | G01L 1/146 |
| | | | | 73/862.391 |
| 8,536,863 B2 * | 9/2013 | Kishida | ................. | G01R 33/07 |
| | | | | 73/862.391 |
| 8,590,386 B2 * | 11/2013 | Takeuchi | ............. | G01R 33/072 |
| | | | | 73/728 |
| 8,978,488 B2 * | 3/2015 | Sato | ...................... | G01L 1/2281 |
| | | | | 73/862.69 |
| 9,574,953 B2 * | 2/2017 | Sato | .......................... | G01L 1/12 |
| 9,745,436 B2 * | 8/2017 | Shigeto | .................. | C08J 9/0095 |
| 9,766,142 B1 * | 9/2017 | Hague | ..................... | G01L 1/122 |
| 11,190,184 B2 * | 11/2021 | Gueissaz | ............... | A63B 69/12 |
| 11,300,397 B2 * | 4/2022 | Kim | ...................... | G01L 1/2231 |
| 11,313,924 B2 * | 4/2022 | David | .................... | G01R 33/09 |
| 11,506,517 B2 * | 11/2022 | Ausserlechner | ... | G01D 5/24442 |
| 11,740,065 B2 * | 8/2023 | Kuehner | ................ | G01L 5/009 |
| | | | | 73/779 |
| 11,920,992 B2 * | 3/2024 | Kuehner | ................ | B25J 13/084 |
| 2013/0194028 A1 | 8/2013 | Brandl et al. | | |
| 2021/0018574 A1 | 1/2021 | Chen et al. | | |
| 2021/0285830 A1 * | 9/2021 | Schmitz | .................. | G01B 7/24 |
| 2023/0103779 A1 * | 4/2023 | Qi | .......................... | B25J 13/082 |
| | | | | 700/258 |
| 2023/0165162 A1 * | 5/2023 | Put | ........................ | G01R 33/07 |
| | | | | 257/421 |
| 2024/0210260 A1 * | 6/2024 | Lu | ............................. | G01L 1/18 |

OTHER PUBLICATIONS

Kawasetsu et al., "Flexible Tri-Axis Tactile Sensor Using Spiral Inductor and Magnetorheological Elastomer", IEEE Sensors Journal, vol. 18, No. 14, Jul. 15, 2018, pp. 5834-5841.

\* cited by examiner

FORCE SENSOR WITH TARGET ON SEMICONDUCTOR PACKAGE

FIELD OF THE INVENTION

The invention relates to the field of force sensors. More specifically it relates to force sensors using position sensing, a sensor assembly, and a manufacture method.

BACKGROUND OF THE INVENTION

Force sensors can be used in robotics to assist robotic manipulation of objects. While optical feedback is commonly used by robots to localize and grasp an object, the force is difficult to control, which may cause faulty manipulation or positioning of the manipulated piece, or even damage to the piece.

Robotic clamps or hands can include force-torque sensors, for example on the mechanical part that drives the motion of the grasping pieces (claws, fingers or the like). However, this measurement is indirect. Measuring the deformation of the contact surface with the piece to be handled is not straightforward. To solve this, in some applications, the surface which contacts the piece to be grasped is flexible. The deformation of the surface can be measured by a position sensor. The position sensor, usually a chip, is covered by a large block of flexible material with wide contact area, several times wider than the position sensor, ensuring reliable contact. However, these sensors usually require large footprint, which is usually available only in large robot claws for heavy duty and large industrial pieces. Additionally, robotic manipulation with these systems present hurdles or cannot be used for manipulation of delicate objects.

It would be desirable to provide a compact solution that allows a reliable force control on a piece by a robotic claw or hand during piece handling.

SUMMARY OF THE INVENTION

It is an object of embodiments of the present invention to provide a compact and effective sensor for sensing forces, especially contact forces, in an accurate way and with small footprint. It is a further object to provide an assembly including such sensor, and a method of manufacture of the sensor.

The present invention provides a force sensor comprising a sensing system comprising a target piece and a sensing element. The sensing element is configured to sense changes of the magnetic field from motion of the target piece with respect to the sensing element, the sensing element being configured to provide a signal representative of changes of the target piece position. An integrated circuit comprises processing means for processing signals from the sensing element. The integrated circuit is packaged in a semiconductor package where its top projection forms an outline. In other words, the projection of the package with the largest area is the outline. In some embodiments of the present invention, the semiconductor package (also known as IC package) includes a mold covering partially or totally the integrated circuit.

A flexible piece comprises the target piece for providing motion of the target piece upon contact with an external body. The flexible piece is attached to the semiconductor package, where the attachment area between the flexible piece and the semiconductor package is smaller than or equal to the outline of the semiconductor package. The flexible piece is arranged for receiving a force stimulus, so that upon exerting a force on the flexible piece, the displacement of the target piece with respect to the surface of the semiconductor package can be sensed by the sensing element.

It is an advantage of embodiments of the present invention that a compact force sensor can be obtained with low footprint, with a target embedded in a flexible piece which is directly integrated on a semiconductor package.

In some embodiments of the present invention, the semiconductor package comprises a surface facing away from the integrated circuit and wherein the flexible piece is deposited or adhered to the surface of the semiconductor package. In some embodiments, the flexible piece is an elastomeric sheet.

It is an advantage of embodiments of the present invention that the elastomeric sheet can be easily provided, for example, by molding and attaching to the semiconductor package.

In some embodiments of the present invention the semiconductor package has a planar shape with a lateral projection with lower area than a top projection of the semiconductor package, wherein the flexible piece is attached to that semiconductor package without extending beyond the top projection.

It is an advantage of embodiments of the present invention that the footprint of the force sensor is as large as a semiconductor package.

In some embodiments of the present invention, the sensing element is a Hall effect-based position sensing element and the target piece is a magnetic target piece.

It is an advantage of embodiments of the present invention that sensing is not affected by the presence of non-ferromagnetic parts.

In some embodiments of the present invention, the sensing element is an inductive sensing element, and the target piece is a conductive target piece.

It is an advantage of embodiments of the present invention that sensing is robust against stray fields. It is a further advantage that magnetic pieces can be manipulated, as they have less influence on the electric field of the inductive sensing element.

It is an advantage of embodiments of the present invention wherein the target piece is a metallic sheet embedded in or provided on the flexible piece.

It is an advantage of embodiments of the present invention that a metallic sheet may be easy to provide on or within the flexible piece, for example it may be a metal plate on or embedded in the flexible piece.

In some embodiments of the present invention, the target piece is a rigid target piece with less flexibility than the flexible piece so that the force stimulus on the target piece deforms the flexible piece.

It is an advantage of embodiments of the present invention that the displacement of the target piece can be accurately measured.

In some embodiments of the present invention, the target piece has a predetermined shape with a largest dimension in the top projection, the semiconductor package has a largest dimension in the top projection, and wherein the ratio between said dimension of the semiconductor package and said dimension of the target piece is 1.5 or larger.

It is an advantage of embodiments of the present invention that the compactness can be improved while facilitating measurement of shear stress.

In some embodiments of the present invention, the target piece is a metal trace deposited on the flexible piece. It is an advantage of embodiment of the present invention that the sensor has a low profile. In alternative embodiments, the target piece is a metal plate. For example, the metal plate may be embedded in the flexible piece.

In some embodiments of the present invention, the sensing element is provided between the integrated circuit and the target piece.

It is an advantage of embodiments of the present invention that the sensitivity of the sensing element is high by placing the sensing element close to the sensed target.

In some embodiments of the present invention, the sensing element (102) is adjacent to the integrated circuit (IC).

It is an advantage of embodiments of the present invention that the sensor has a low profile. It is a further advantage that the IC substrate can be offset over the flexible piece so the substrate does not receive direct stress from the contact of external objects with the flexible piece.

In some embodiments of the present invention, the sensing element is integrated with the processing means in the integrated circuit (IC).

It is an advantage of embodiments of the present invention that the sensor has very compact and a low profile.

In a further aspect, the present invention includes a sensor assembly comprising the force sensor of the first aspect of the present invention wherein the integrated circuit (IC) is further adapted to provide readout signals based on the processed signals from the sensing element. The assembly further comprises a support structure, wherein the force sensor is provided on the support structure including connections for rerouting readout signals generated in the force sensor to an external output. The support structure may be a PCB, but in some embodiments the sensor assembly is a PCB-less sensor.

In a further aspect, the present invention includes a method of manufacture of a force sensor comprising:
  providing a flexible piece including a target piece,
  providing an integrated circuit comprising processing means and a sensing element configured to sense changes of the magnetic field from motion of the target piece, the sensing element being configured to provide a signal representative of the position of the target piece and the processing means adapted for processing signals from the sensing element,
  packaging the integrated circuit by overmolding the sensing element and the processing means thus forming a semiconductor package,
  attaching the flexible piece to the semiconductor package and optionally to the integrated circuit where the attachment area of the flexible piece does not extend beyond the top projection of the semiconductor package when attached.

It is an advantage of embodiments of the present invention that a sensitive and compact force sensor can be provided, with low profile and small footprint.

In some embodiments of the present invention, providing a flexible piece including a target piece comprises embedding a target piece inside the flexible piece so the target piece is completely surrounded by the material of the flexible piece.

It is an advantage of embodiments of the present invention that the manufacture of the flexible piece can be done simultaneously with the provision of the target piece, rather than requiring a further step of attachment of the target piece to the flexible piece.

In some embodiments of the present invention, attaching the flexible piece comprises attaching the flexible piece so that the top projection of said flexible piece does not extend over the top projection of the integrated circuit.

It is an advantage of embodiments of the present invention that the manufacture can be made compact and separate from the PCB fabrication if required.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
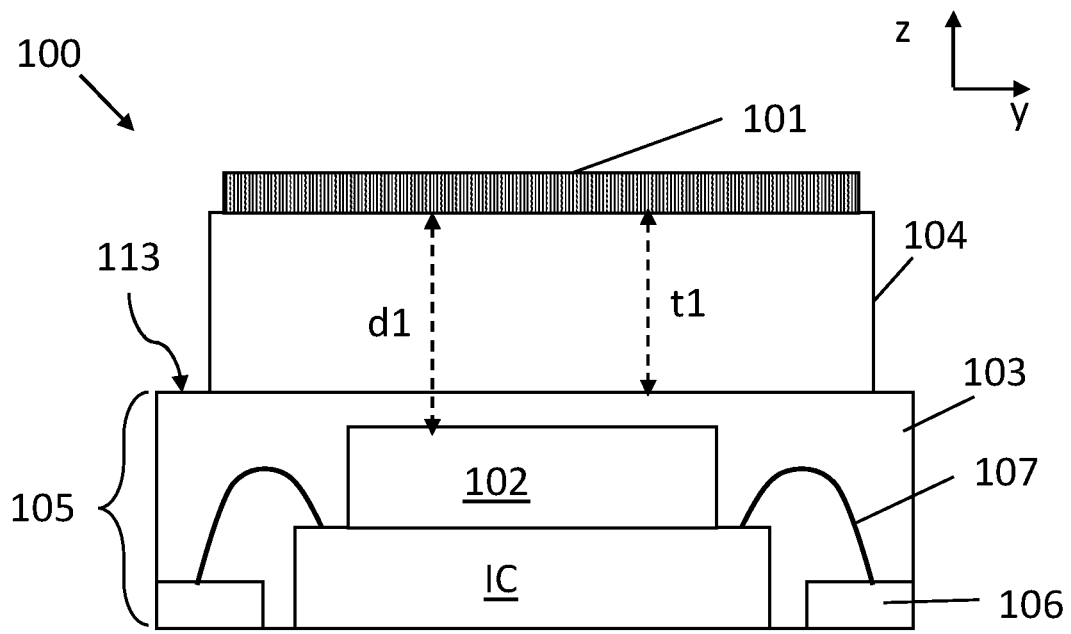
FIG. 1 illustrates a cross section of a force sensor in accordance with embodiments of the present invention, showing chip connections.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "integrated circuit", reference is made to a semiconductor substrate including electronic components forming a circuit for a purpose, for example processing signals and providing readout signals based on the processed signals.

Where in embodiments of the present invention reference is made to "target piece" or "target" for short, reference is made to a shaped piece of material whose position variation is sensed by a sensing element.

Where in embodiments of the present invention reference is made to "flexible piece", reference is made to a shaped piece of material with flexible properties, for example it may be compressible, and it preferably has elastic properties, so it returns to the original shape in the absence of forces. Compression on the flexible piece provides a displacement of the material matrix forming the piece. In some embodiments, the term "elastomer" will be used, but the present invention is not limited to pieces made by elastomeric polymers.

The present invention aims to improve automatized grasping and handling of objects. Robots grasp objects supported by computer-aided vision feedback. To achieve human-like dexterity, robotic hands or claws need to incorporate tactile sensors. These sensors need to be small and able to detect forces within a range sensitive enough for the required application. The present invention provides a force sensor for sensing contact of a robotic hand or claw with an object to be handled.

The present invention provides force sensing based on proximity sensing using a sensing element which senses changes of position of a movable target. The extent of the target motion depends on the contact force (both in magnitude and direction) of the claw with the object to be handled. Sensing may be based on an electromagnetic sensing. For example, it may be based on the detection of variations of a magnetic or, in general, electromagnetic field, due to the target motion. The target may generate a magnetic field, for example it may be a magnet, or it may be a conductor in which a magnetic field can be induced. The sensing element may sense changes of the position depending on the nature of the field. The sensing element produces signals which are processed by processing means in a packaged integrated circuit. The target piece and the sensing element may be appropriately chosen and combined, thus forming a 'sensing system' with elements adapted to cooperate with each other to generate or induce an electromagnetic field whose changes are caused by motion of the target and whose detection by the sensing element can be correlated with the amount of displacement of the target. For example, a magnetic sensing element (e.g., a Hall sensor) may be combined with a magnet as a target.

Motion of the target piece due to contact is provided by an elastic or flexible piece which supports the target piece. Upon contact, the flexible piece deforms in accordance with the contact force. The target piece, being part of the flexible piece, also moves.

The processing means is configured to accept the signal from the sensing element and process it to provide the contact force. For example, the processing may include comparison and correlation with stored values (e.g., in a lookup table) which link the signal measured with displacement of the target, or calculation based on mathematical relationships including e.g., the compression modulus of the flexible piece, calculation of displacement of the target, etc.

The sensing element and the processing means used to process the measurement are included in a single semiconductor package. The flexible piece is provided on the semiconductor package, the flexible piece being smaller than the package itself, without completely surrounding the package.

By integrating the elastomer and target directly onto the package and keeping it also within the package outline borders, it provides a significant advantage towards compactness and integration with a claw or robot hand or the like.

In a first aspect, the present invention relates to a force sensor, in particular a sensor for sensing contact forces between an object and a grabbing robotic hand or claw. It includes a sensing system including a sensing element which can sense the position displacement of a suitable target, and the target itself. It also includes a processing means (e.g., a processor) provided in a semiconductor package, also called integrated circuit package, or IC package for short, although in embodiments of the present invention the IC package also includes the sensing element, not only the IC with the processing means. The processing means receives measurement signals from the position sensing element. These signals indicate displacement of the target piece included in a flexible piece deposited on or attached to the IC package.

In some embodiments, the target piece may comprise of magnetic material, and/or electrically conductive material, depending on the type of sensing element. For example, it may be a magnet for a Hall sensing element. For example, it may be a metal sheet, plate or trace, for an induction-based sensing element.

The flexible piece does not surround completely the IC package. For example, it may only partially overlap the IC package. The IC package layout, or overlay, or top view, contains completely the attachment area of the flexible piece. For example, the flexible piece may not extend beyond the outline of the IC package. The footprint of the force sensor is the area which the sensor occupies on a larger system, for example a PCB. The force sensor of the present invention has a footprint as large as the IC package, instead of being a large piece of rubber or other elastomer overlapping the processor and the sensing element.

FIG. 1 shows an exemplary embodiment of a force sensor 100 including a Hall sensing element 102 placed on and connected to the integrated circuit IC. The sensing element 102 may be a different type of proximity detector (such an induction-based sensing element), as long as it can detect at least the variation of position of a target.

The force sensor 100 comprises a package 105 including an integrated circuit IC and the sensing element 102 which are covered or encapsulated by a mold 103, such as resin or the like, or any other known materials. FIG. 1 shows the sensing element 102 in contact with the integrated circuit IC, the sensing element being an element surrounded by the package 105, for example embedded in the same mold as the circuit IC, except where it is in contact with the circuit IC. The relative position of the sensing element with the circuit is explained below. The sensing element 102 may be monolithically integrated in the IC.

In some embodiments, the integrated circuit package 105 may be a 'small outline integrated circuit' (SOIC), a 'quad flat no leads' (QFN) package, etc. In any case, the package 105 has usually a flat profile, with a relatively large surface area on the top projection, compared with the small, narrow area of the lateral projection of the package 105. FIG. 1 shows the lateral view of the sensor. The area of the surface corresponding to the top projection will be named top surface 113 for short. It is an external surface, facing away from the internal circuit IC. Typically, it is a planar, flat surface, but it may have other profiles.

The force sensor comprises a flexible piece 104, such as a compressible sheet or plate, for example an elastomer. The flexible piece includes a target piece 101, where at least one surface may be uncovered to provide contact with the piece to be grasped. For example, it may be adhered on the top surface of the elastomer facing away from the top surface 113 of the package, forming a layered stack. Alternatively, the target piece may be partially or completely embedded within the flexible piece, as shown in the FIG. 2 and FIG. 3 described below.

In the example of FIG. 1, the target piece 101 may be a magnet, for example, a two-pole magnet having an axial magnetization, perpendicular to the top surface of the integrated circuit IC (the surface of the IC facing the elastomer). However, the present invention is not limited to this, and magnets with other magnetization (different orientation, different multipolarity) can also be considered.

In some embodiments the target piece may be a plate such as a planar plate or sheet, providing a relatively wide area for contact, thus allowing sensing contact forces. In some embodiments it may be stiffer than the flexible piece. The target piece may be a very thin sheet of material, e.g. a metal trace deposited on the elastomer, or embedded therein, etc. The target can also be formed with a suspension of discrete metallic parts in the elastomer (e.g., metallic or magnetic beads and/or powder). The sensing element is sensitive to changes of position of the target piece, which is in turn configured to be detected by the sensing element 102.

Figure 3:
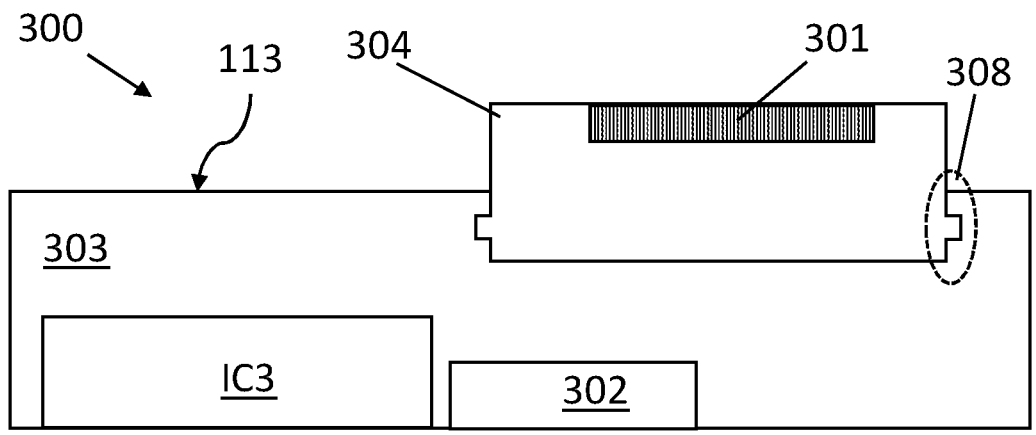
FIG. 3 illustrates a cross section of a force sensor in accordance with embodiments of the present invention, where the sensing element is laid out adjacent to the integrated circuit containing the processing means.
Figure 4:
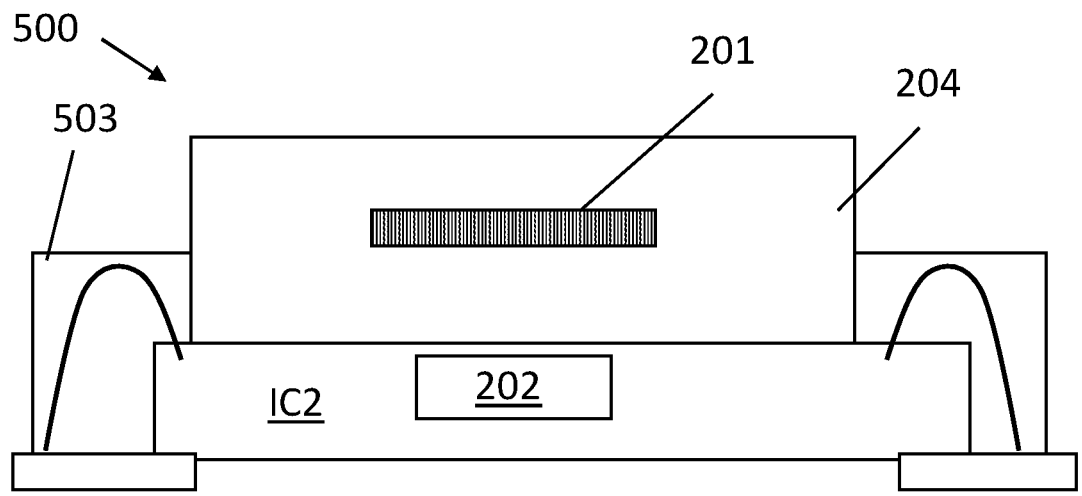
FIG. 4 illustrates a cross section of a force sensor in accordance with embodiments of the present invention, where the elastomer is surrounded by mold of the integrated circuit package and in contact or adhered to the substrate of the integrated circuit.

The flexible piece 104 is provided on the external surface of the semiconductor package 105, for example directly on the top surface 113 of the encapsulant or mold 103. The 'top' refers to the part of the package facing the object to be contacted, so the flexible piece 104 is arranged for receiving a force stimulus. In particular, the elastomer is on the IC package, not on a different support such as a PCB or a spacer or the like. The elastomer is directly adhered to the IC package. In order to obtain a good compact force sensor, the flexible piece does not completely overlap the package. In the embodiment of FIG. 1 the flexible piece is attached to an area of the mold smaller than the top surface 113 of the mold, although in other embodiments the attachment area may be equal to the top surface 113 of the mold. In some embodiments, at least part of the flexible piece may be partially embedded by the IC package, for example in its mold. An exemplary embodiment is shown in FIG. 3, although said configuration may be present in any other embodiment of the present invention. In some embodiment of the present invention, the elastomer is in contact with the IC as shown in FIG. 4 below.

Now turning to the sensing element, as explained earlier, it is configured to measure the relative displacement of the position of a target piece with respect to the IC package containing the sensing element. This displacement depends on force applied on the flexible piece including the target piece, from which a signal is obtained and processed by the processing means of the IC circuit. In particular embodiments, the sensing element is a sensing element for sensing EM fields, in particular changes of EM fields due to said motion: in case of compression, the larger the compression, the more the target will approach the sensing element, which is detected by the sensing element, and larger contact force will be detected.

The sensing element can measure a position in general, for example a linear position, or an angular position. In some embodiments, the sensing element may measure a magnetic strength, depending on the magnetic flux and changes thereof, which may be related to the proximity of the target piece to the sensing material (which in turn can be linked to the compression force). The sensing element may be a Hall effect-based position sensing element, and the target piece may be a magnet whose magnetic field can be sensed by the position sensing element. When a force is applied on the flexible piece, the target piece changes its position accordingly relative to the Hall sensors, which provide a measurement signal dependent of the motion of the target. In some embodiments, the sensing element is an inductive sensing element with coils through which a known current flows, which generates a magnetic field through a conductive target. Changes in the target position induce a current on the target, which affects the magnetic field. This effect is detected as changes of current flowing through the inductive coils, so the sensing element can sense changes of the position of the target piece relative to the sensing element. Accordingly, the target may be a metal plate, metal trace or the like, as long as it provides sufficient conductance to provide signal (e.g., via high enough eddy currents). It is noted that the inductive solution enables stray field robustness, while the magnetic solution allows measurement of contact with conductive and ferromagnetic materials.

The change of magnetic field strength (indicative of position) due to compression, on the Z direction, is only one possibility. In embodiments of the present invention, the sensor can measure alternatively or additionally shear stress (displacement in at least the X directions which is perpendicular to the normal of the contact surface, e.g., perpendicular to the direction of the compression force) by suitable configuration of the sensing element or elements.

The integrated circuit IC includes at least the integrated processing means, such as a processor, which can be provided on a semiconductor substrate (e.g., silicon substrate, the present invention not being limited thereto). The processing means is configured or programmed for processing signals from the sensing element 102. The processing means and the sensing element are suitably connected, so the processing means can receive said signals. The processing means may be configured or programmed to process the positioning displacement information into signals representative of the contact force, and provide such signals as readout signals indicative of the force exerted on the target piece causing its displacement. At least the displacement of the target, the elastic parameters of the flexible piece and other parameters, such as e.g. acceleration, may be used for calibration of the force sensor. The readout signals may be output, for example to a conductor, e.g., a frame 106, via wiring. The readout signals can be obtained through connections via contacts, pins, etc. to an external circuit such as a PCB, the present invention not being limited thereto.

The sensing element and the IC are both encapsulated in the same package. In the embodiment of FIG. 1, the sensing element 102 is connected to the IC and placed on top thereof, so the sensing element 102 is placed between the flexible piece 104 and the IC, separated from the flexible piece 104 by mold 103 of the package.

The target piece 101 is spaced from the sensing element 102 by a first distance d1 encompassing the distance (d1–t1) between the sensing element 102 (or the part receiving the sensed field) and the flexible piece 104, plus the thickness t1 of the flexible piece which ensures that enough flexible material is provided, so a measurable displacement takes place for a predetermined range of contact forces on the flexible piece. Distance d1 between the target piece and the sensing element can be optimized by selecting the appropriate flexible piece and the thickness t1 thereof, so that there can be enough displacement on the target piece to be sensed by the sensing element, but avoiding the thickness to be so large that the field from the target (e.g., magnetic field) is weakened at the position of the sensing element 102. Calibration data can also be provided and stored in, for example, a memory, e.g., an integrated memory.

Figure 2:
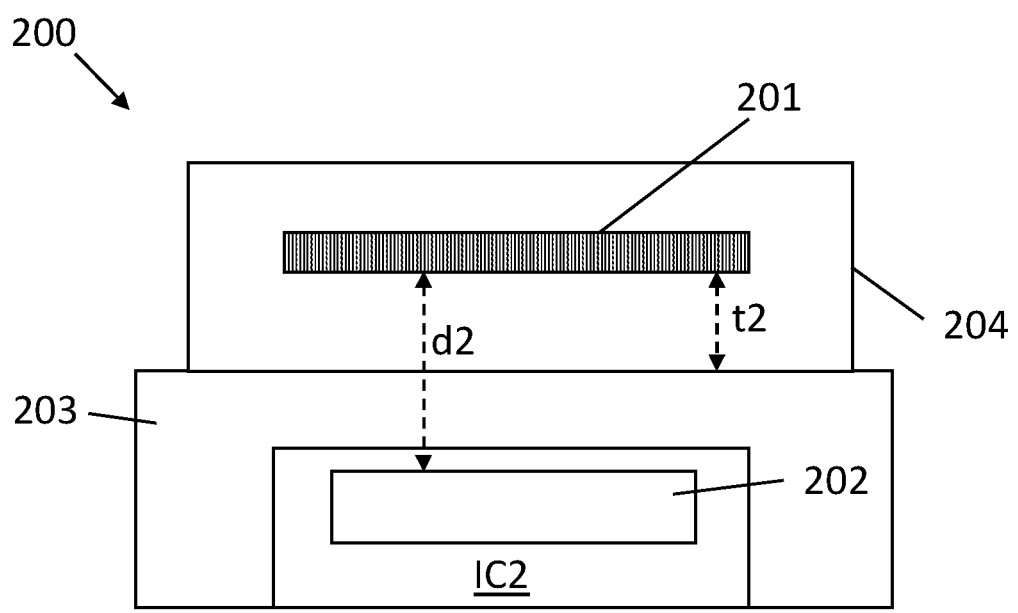
FIG. 2 illustrates a cross section of a force sensor in accordance with embodiments of the present invention, where the sensing element and the processing means are integrated in a single semiconductor substrate forming one integrated circuit.

In other embodiments, as shown in FIG. 2, the sensing element 202 and processing means can be integrated in the same integrated circuit IC2. This configuration can be applied to any other embodiment, not being limited to the embodiment of FIG. 2.

FIG. 2 shows a force sensor 200 including a compact elastomer 204, for example an elastomeric sheet, completely embedding the target piece 201. As before, the thickness t2 of the flexible piece can be tailored, so as to provide enough cushion to improve sensitivity of the sensing element while at the same time keeping the distance d2 between the target piece 201 and the sensing element 202 not so large that it hinders significantly the signal detection characteristics (such as e.g., signal to noise ratio). The target piece 201 may be covered by a shielding layer or it may be embedded within the elastomer 204, specially shielding the target piece 201 from physical contact with external pieces or from potentially corrosive or oxidating environment, also in the case of embedding the target piece 201 in the flexible piece potentially improving compactness.

FIG. 2 also shows that the integrated circuit IC may also integrate the sensing element 102. Thus, the package can be very compact, as the mold 203 still encapsulates both the sensing element and the processing means, but both in a single integrated circuit, e.g., in a single semiconductor die. This embodiment is very compact and has low profile and footprint, due to the combination of the sensing element-processing means integration and the target-elastomer integration. However, the elastomer integrating the target may be applied to any other embodiment, as well as the integrated circuit IC integrating the sensing element can be applied to any other embodiment. The sensing element or parts thereof may be integrated in the same semiconductor substrate as the processing means, forming an integrated circuit with both. In other embodiments, only some parts of the sensing element may be integrated in the semiconductor die.

In alternative embodiments, as shown in FIG. 3, the sensing element 302 can be placed adjacent to the integrated circuit IC3 with the processing means. The signals may be transmitted from the sensing element 302 to the processing means by wirebonds, for example. The integrated circuit and the sensing element 302 do not even need to be in physical contact, both of them are however encapsulated in the same mold 303. In general, the sensing element may be overlapped by the target. The target piece may be centered with the sensing element or, in the case of the embodiment of FIG. 3, the sensing element (and the integrated circuit IC3) may be laid out offset from the center of the target and for example also from the whole flexible piece. The force sensor has larger footprint, but potentially lower profile (less height) than other embodiments such as e.g., the embodiment of FIG. 1, in a simple layout of easy manufacture. This configuration also reduces risks to damage the circuit with the processing means, because most or all pressure from the contact forces is not transmitted through the flexible piece 304 and mold 303 directly on the integrated circuit IC3, thus protecting the processing means in the integrated circuit IC3.

FIG. 3 also shows a flexible piece 304 partially embedded in the mold 303. This feature may be applied to other embodiments, not necessarily to the one of FIG. 3 only. The mold 303 may be shaped to fit the flexible piece 304, thus reducing the risk of tearing the flexible piece away from the package due to shear forces perpendicular to the compressing forces. For example, the mold and the elastomer may be shaped so they interlock, e.g., including interlocking elements 308 such as ribs and slits. Less or no adhesive need to be provided to attach the flexible piece to the mold, thus advantageously saving costs. For example, the flexible piece may be flush with the mold surface, so no adhesive is absolutely required. As before, the surface of the flexible piece keeping it fixed in place is smaller than the area of the package where the flexible piece is provided (e.g., it does not extend beyond the package). For example, the top projection of the flexible piece may not extend beyond the top projection of the package, thus allowing a compact force sensor with small footprint. The top projection may also be understood as the direction following the applied contact force to be measured.

In some embodiments, the top projection of the target is also contained with the area of the IC package. In other words, the target may be smaller than the IC package, e.g., smaller area and/or smaller volume. Although a small target (e.g., small magnet) is only able to provide a weak field to be detected by the sensing element, due to the compactness of the device the target may be positioned closer to the sensing element, compensating for the small size. In some embodiments, the size ratio between the IC and the target piece is 1.5 or more, for example between 1.5 and 3, or even larger than 3.

The target piece 301 may be partially embedded in the flexible piece 304, for example it may be flush with the flexible piece. The force sensor may be configured to provide dual sensing, allowing detecting shear forces, for example shear forces in one direction or two orthogonal directions in the plane perpendicular to the direction of the compressing forces.

Signals generated by the sensing element in the integrated circuit can be processed into readout signals, which can be output by connections from the integrated circuit to the exterior (e.g., through wires, a frame 106, pins, etc., not pictured in FIG. 2 or FIG. 3). The exterior may include a support structure holding the force sensor and conductors for sending the readout signals from the processing unit in the integrated circuit to an external device.

In some embodiments, the support structure is a PCB.

The present invention is not limited to attachment of the flexible piece to the top surface of the mold of the package. For example, the mold of the package may comprise an opening or cavity exposing the interior, e.g., the semiconductor material of the IC substrate, or even the sensing element. The IC substrate can receive the flexible piece as shown in FIG. 4. Thus, the flexible piece may be attached to the semiconductor package, being held in place by the mold, optionally further being attached to the integrated circuit, e.g., to the substrate of the IC. In other embodiments, the flexible piece may be in physical contact or adhered to the sensing element. Thus, the mold may only partially cover the IC substrate, leaving space to receive the flexible piece.

In preferred embodiments, the target piece is completely supported or embedded by the flexible piece. For example, the target piece is smaller than the flexible piece, for example the target piece may be completely contained in the top view or outline of the flexible piece.

The fact that the target is smaller than the package, so the target is contained in the outline of the IC package, allows to detect shear stress easily. It is advantageous that the magnet is smaller than a ratio of the outline. For example the side of the flexible piece (e.g. the largest side, e.g. the diameter if the top view is a circumference) and the largest dimension of the target piece may have a ratio of 1.5, or 2, or 3. The exemplary force sensor on which simulations were made as shown in FIG. 6 to FIG. 9 had a target with a diametral dimension of 1.5 mm and a side of the outline of 5 mm (ratio 3).

Shear stress can advantageously be resolved with accuracy, as the field changes noticeably, when the outline (e.g. top view) of the magnet is smaller than the outline (e.g. top view or top surface) of the IC package, in particular with ratios equal to or larger than 1.5, e.g. between 1.5 and 3. This applies to both magnetic and inductive sensing (thus, for magnetic targets and inductive targets).

Despite the small size of the target, and thus the smaller field available for sensing, it has been found that the field can still be measured at the sensor location with the configuration of the present invention.

The shear stress detection is not limited to magnetic detection systems. For example, the skilled person can suitably adapt other systems for detection of shear stress. In a particular exemplary embodiment with induction sensing, two induction coils per axis may be located around the neutral position of the target. At the neutral position, the signals are balanced. When the inductive target moves right or left, the signal (or a ratio of signals) will be unbalanced and a displacement can be detected. When the target moves up or down, the intensity changes.

In some embodiments, the sensor can measure compression (displacement in Z direction, see FIG. 1 or FIG. 4). In some embodiments, the sensor can measure shear stress (displacement in the X/Y directions, see FIG. 1 or FIG. 4). In some embodiments, it can measure displacement in the three directions.

In some embodiments, the sensor can eventually also measure torsion, not only translation of the magnet in the x/y/z directions but also rotation of the magnet (for example defined by two angles). This can be implemented, for example, with a 3D sensor, for example a 3D Hall sensor made of a combination of horizontal Hall elements (sensitive to motions with direction perpendicular to the IC) and vertical Hall elements (sensitive to motions with direction parallel to the IC). In some embodiments, the implementation can provide a 3D sensor made of horizontal Hall elements and magnetic concentrators disposed so as to concentrate components of the magnetic field in different directions separately. In some embodiments, magneto-resistive elements, such as AMR, or GMR, or TMR can be used.

Any component or combination of components (Bx, By, Bz) can be used to detect the displacement in different directions. Bz is not bound to measurement solely of compression, and Bx, By is not bound to shear stress measurement.

FIG. 6 to FIG. 9 show stress tensor variation and simulations of compression and shear tests of a force sensor which may be, for example, a 6×6 mm QFN IC package with one magnetic probe (although the present invention may include more probes) on a support and may receive on the top surface a piece of elastomer with a height of 2.5 mm and a top area of 5×5 mm, where the IC package completely surrounds the elastomer. The target piece may be a magnetic disk of 1.5 mm diameter and 0.5 mm thickness, flush with the surface of the elastomer opposite to the surface attached to the IC package, and in the center of the top projection of the elastomer. The probe itself may be offset with the axis of the magnet, for example it may be at a distance in the order of 1 mm from the axis. In embodiments of the present invention, the sensing element or sensing elements may be offset with the axis crossing the center of the target piece up to 2 mm or less. For two probes, the target may be at the same distance of both while not under a contact force.

In some embodiments, the sensor may include one sensing element, which may be centered or not with respect to the target piece. In those embodiments where it is not centered, the sensing element may not overlap with the target piece in the top projection. In the exemplary simulations, the probe is located outside the outer periphery of the top projection of the target piece (magnet). For multiple probes, in some embodiments they may be laid out symmetrically around the axis of the target piece (e.g., on the vertices of a square, if there are four sensing elements, where the axis of the target piece passes through the center of the square).

Figure 6:
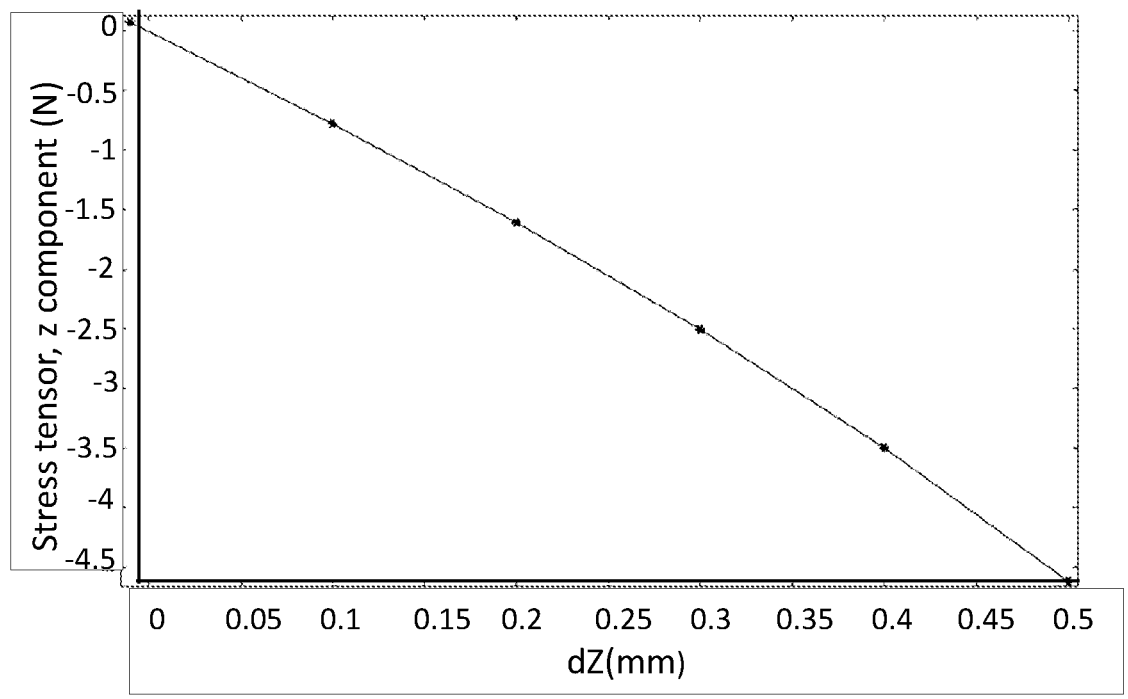
FIG. 6 and FIG. 7 show the simulations of force response to normal displacement (compression) for a particular force sensor and the response of the three spatial components of the magnetic field to the displacement.
Figure 7:
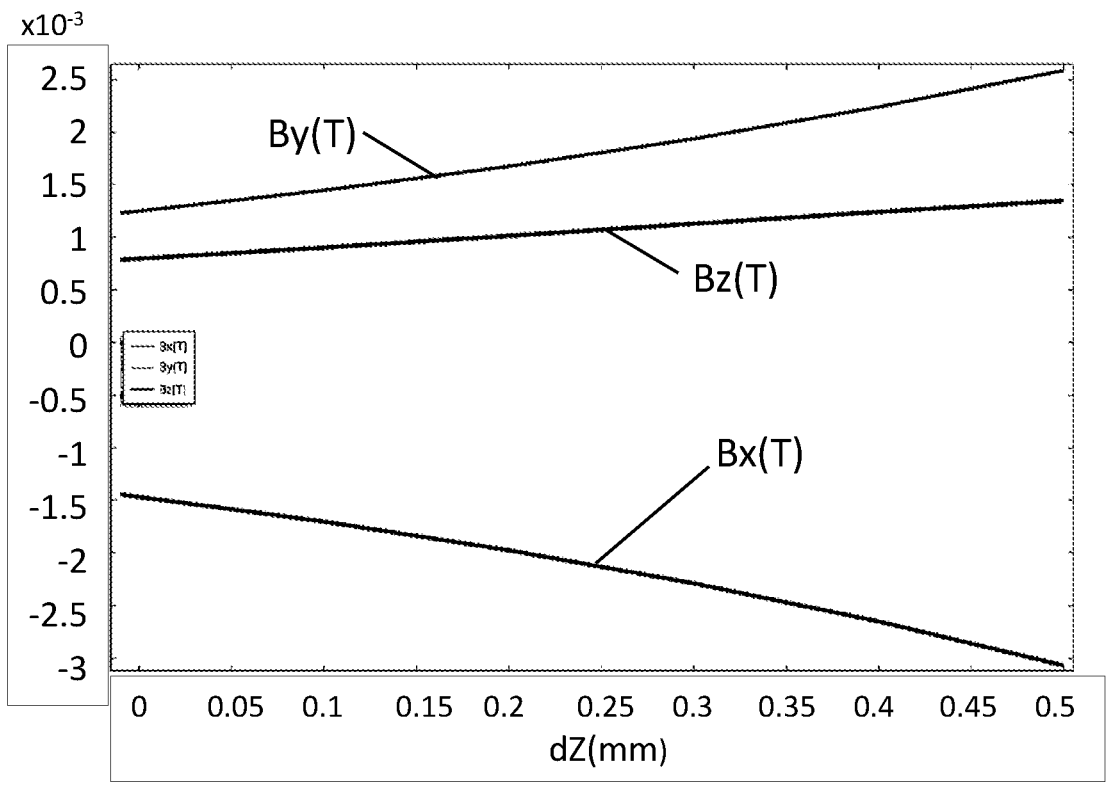
Figure 8:
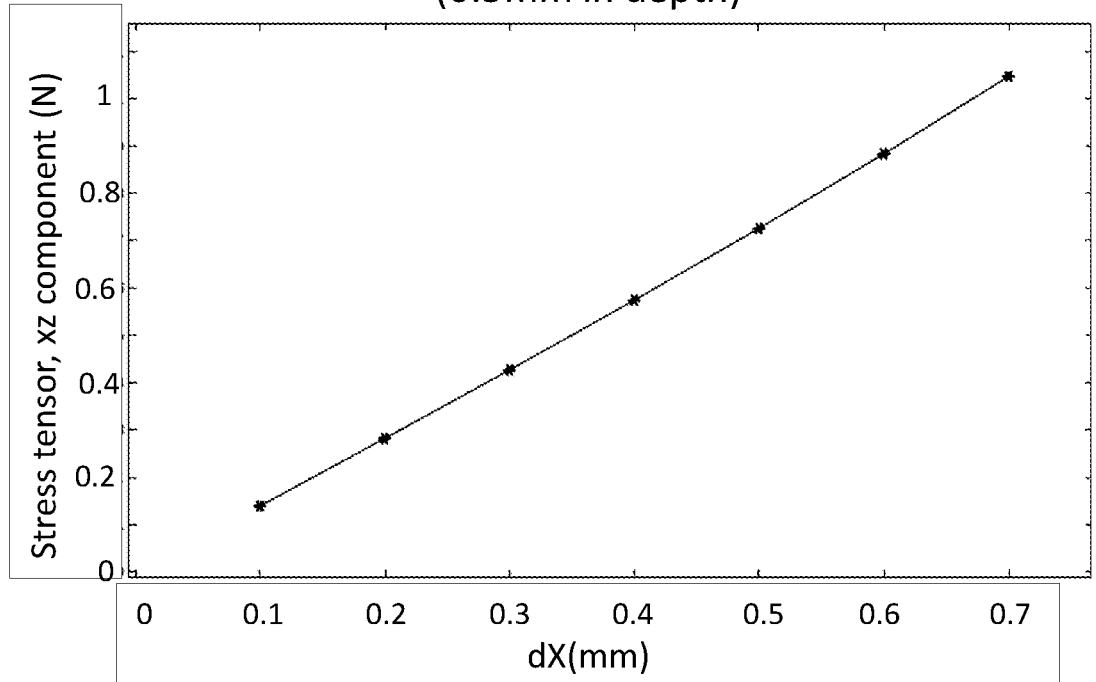
FIG. 8 and FIG. 9 show the simulations of force response to normal displacement (compression) for a particular force sensor and the response of the three spatial components of the magnetic field to the displacement.
Figure 9:
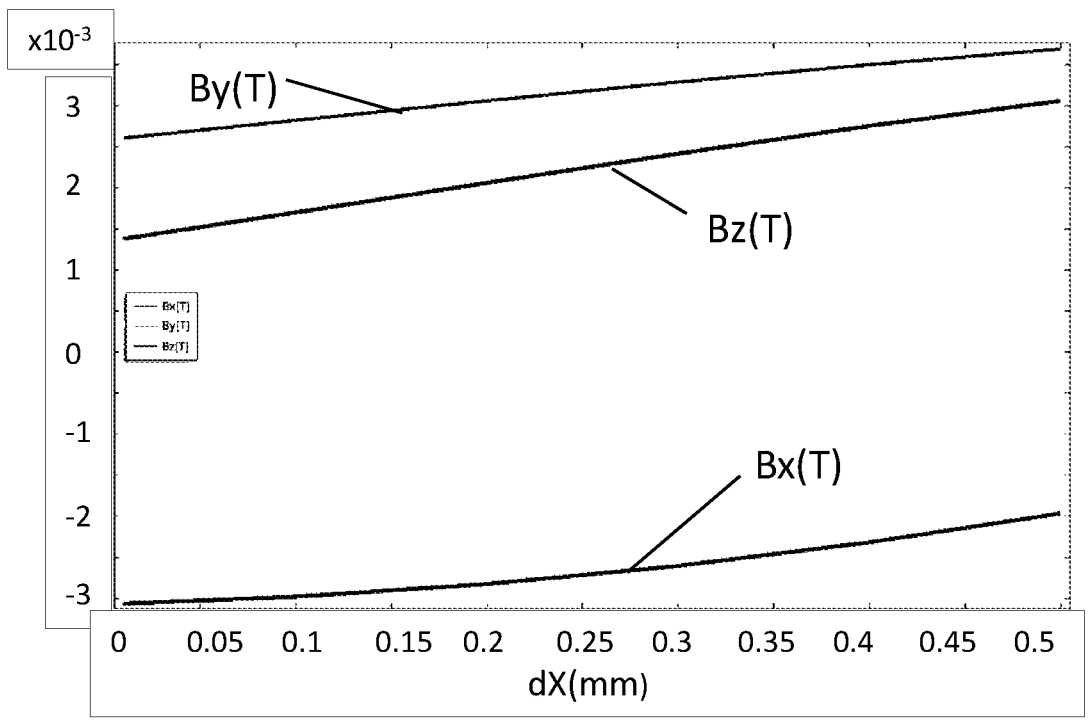

FIG. 6 shows the normal force (in Newtons) as function of the compression displacement (in mm) for the exemplary force sensor described above. The simulation of the magnetic field variation with the position, using one probe, is shown in FIG. 7, for the three dimensions (X, Y, Z). On the other hand, FIG. 8 shows the shear force (in Newtons) as function of the compression displacement (in mm) for the same force. The simulation of the magnetic field variation with the position, using one off-centered probe, is shown in FIG. 9, for the three dimensions (X, Y, Z).

In a further aspect, the present invention provides a contact sensor assembly including the force sensor of the first aspect, and further including a support structure for the force sensor. For example, the support structure may provide transfer of signals from the force sensor to an output or data storage or the like. Such output may be a user interface such as a screen. The output or data storage may also be part of the assembly.

Figure 5:
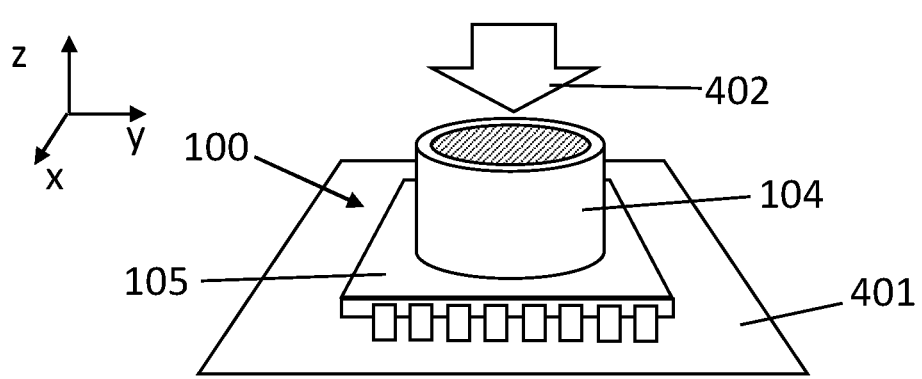
FIG. 5 illustrates a perspective view of a force sensor in accordance with embodiments of the present invention on a support substrate, forming a sensor assembly.

FIG. 5 shows a perspective view of an exemplary embodiment of the assembly of the present invention. The force sensor 100 is provided on the support structure 401, and the top surface of the IC package 105 completely surrounds the flexible piece 104 of the force sensor 100, so the flexible piece 104 does not extend over the support structure 401, as it is limited by the top surface 113 of the mold 103 of the package (as shown in FIG. 1). The support structure 401 may comprise connections and conductive paths such as conductive tracks, for rerouting signals provided by the force sensor 100 to a device for storing and/or displaying data.

For example, the integrated circuit IC may receive signals from the sensing element 102, representative of the motion of the target 101 (see FIG. 1) caused by a contact force following the compression direction 402, on the flexible piece supporting said target. The integrated circuit IC can be configured to process these signals and provide readout signals, which are rerouted to a display, data storage or the like through conductive tracks in the PCB being the support structure 401. The force sensor may be connected to conductive paths in the support structure via contacts through the package of the sensor to the integrated circuit.

The contact sensor assembly is not limited by a PCB being the support structure, and the assembly may be a PCB-less assembly. In this case, the chip package may be contacted (e.g., soldered) to electrical leads and clipped or glued or 'heat-stacked' to a plastic assembly. These possibilities are further explained with reference to FIG. 32 to FIG. 43 of document US20210018574A1 and the paragraphs describing said figures (e.g. [0297] to [0324]).

Figure 10:
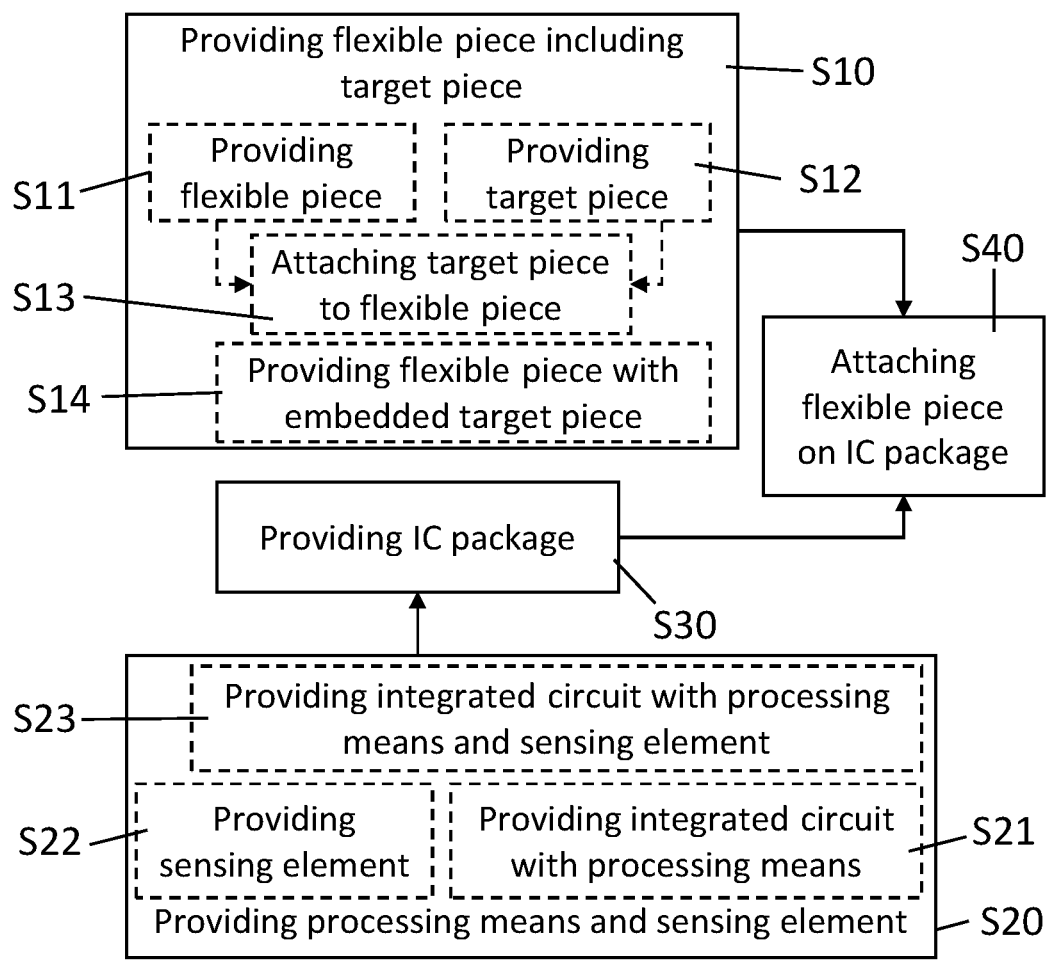
FIG. 10 is a schematic diagram of a manufacturing method of a force sensor in accordance with embodiments of the present invention.

In a further aspect, the present invention provides a method for manufacturing the force sensor of the first aspect of the present invention. The method can be divided in three main manufacturing steps: manufacturing the flexible piece, manufacturing the IC package, and providing the flexible piece on the IC package. FIG. 10 shows a simplified scheme for manufacturing the force sensor. The method includes providing S10 a flexible piece including the target piece, providing circuitry S20 with sensing means and processing means (such as a sensing element and an integrated processor), packaging S30 the circuitry and finally providing the force sensor by attaching S40 the flexible piece including the target piece to the IC package.

Providing S10 the flexible piece including the target piece may comprise integrating or embedding S14 the target piece with the flexible piece, for example by molding the flexible piece with the target piece inside the flexible material, thus completely embedding the target piece inside the flexible piece. Embedding S14 the target piece inside the flexible piece allows protection of the target against the environment and against damage from contact with the object to be grasped, but the thickness between the contact surface of the flexible piece and the target should not be so large the contact forces are dampened, thus reducing sensibility.

However, the present invention is not limited thereto, and the method may include separately providing S11 the flexible piece, providing S12 the target piece, and then attaching S13 the target piece to the flexible piece, which is a simple process. This attachment can be done with adhesive, for example on the surface of the flexible piece, or without adhesive, by fitting the target piece inside an open hole in the flexible piece. The target piece may be a metal trace deposited on the surface of the elastomer, for example. The target piece may be only partially embedded, where only a part of the target piece is external (e.g., a surface of the target) while the rest of the target piece is surrounded by the flexible piece. Optionally the target piece may be further covered by a shielding layer to protect it from damages from the contact with external pieces and/or environment.

The flexibility of the piece can be chosen by choosing suitable materials, and the thickness of the flexible piece between the target and the surface to be attached to the IC package can be optimized taking into account the range of displacement (deformation) under contact forces, which improves with the increasing thickness, and the sensitivity of the sensing element, which drops with distance between sensing element and the target piece. Additionally, a low profile is preferred.

Providing the target may comprise providing a suitably shaped magnet or metal piece, e.g., sheet, with a resistivity such that it is suitable for inductance sensing.

Providing the flexible piece S10, S11, S14 may comprise providing an elastomeric polymer, such as silicone rubber. In some embodiments it may comprise molding, e.g., injection molding the piece in a predetermined shape and size, e.g., including a surface for attaching to a surface of the IC package without surpassing the boundaries of said surface of the IC package.

Providing S20 an IC with a processor and the sensing element may comprise separately providing S21 an integrated circuit with a processor and providing S21 a sensing element, and electrically connecting them, so the signals from the sensing element can be sent to the integrated circuit. In some embodiments, it may further comprise attaching them together, for example the sensing element may be placed on the side of the IC facing the target. In some embodiments, they may be laid out adjacent to each other, for example on a common support or frame. In alternative embodiments, the sensing element may be provided in the integrated circuit; in other words, the method may comprise providing S23 the processing means, and the sensing element integrated in the same integrated circuit IC.

Subsequently, the method comprises packaging S30 the sensing element and the processing means in the integrated circuit together, for example by overmolding both elements, thus providing a packaged integrated circuit with a sensing element and processing means for processing signals generated by the sensing element.

Packaging S30 the IC and the sensing element may comprise providing an IC package with a planar profile, where the largest surfaces are opposite to each other. The packaging may be done by orienting the sensing element so it faces one of these largest external surfaces of the IC package, which is known in the frame of the present invention as the 'top surface' 113 as explained with reference to FIG. 1. For example, it may be closest to the top surface.

In some embodiments, packaging S30 may comprise providing an IC package by overmolding the IC and sensing element while leaving a cavity for receiving the flexible piece. The IC and/or sensing element may be only partially overmolded, so the flexible piece can be attached to the IC or sensing element of the IC package.

The flexible piece and the IC package are attached to each other S40. The attachment of the flexible piece is done so as to allow the maximum displacement of the target piece relative to the IC package upon contact. In some embodiments, upon attachment the IC package is oriented, so the sensing element faces the target, e.g., is closest to the target, e.g., is closest to the top surface where the flexible piece is provided. The attachment may be done with no adhesive, by interlocking elements provided in the IC package upon molding and on the flexible piece, or by addition of an adhesive layer. The attachment may be done directly on the IC or sensing element by fitting the flexible piece into a cavity provided in the mold of the IC package, as explained above. In any case, no spacer is required between the IC package and the flexible piece.

The attachment is done S40 so that the surface of the flexible piece is attached only to the surface of the IC package. For example, the flexible piece may not be attached to any substrate outside the IC package. In some embodiments, the shape of the elastomer and its positioning results in that the top projection of the flexible piece is confined to the area of the top surface of the package, reducing sensor footprint.

The attachment may be done so that the axis of the target piece passes through a sensing element so the sensing element will be centered. In other embodiments, the attachment may be done so that the axis does not cross any sensing element, where the sensing element is at a distance of 2 mm or less from the axis.

In embodiments of the method, the force sensor may be attached to a substrate such as a PCB, thus obtaining a force sensor assembly. The attachment may include soldering the IC package to the PCB, if present. This can be done for example after or before attaching the flexible piece on the IC package.

It is noted that the method may be adapted for the production of a sensor in accordance with any of the embodiments of the first aspects. For example, the target piece and the IC package may be provided so the target piece is at least 1.5 times smaller in at least one dimension than the IC package, for example 3 times smaller, or even smaller, the at least one dimension being measured as from the top projection of the force sensor.

The invention claimed is:

1. A force sensor comprising:
a flexible piece provided with a target piece,
a sensing element configured to sense changes of a magnetic field from motion of the target piece with respect to the sensing element, the sensing element being configured to provide a signal representative of a position of the target piece,
an integrated circuit configured for processing signals from the sensing element,
a semiconductor package comprising a mold covering, partially or totally, the integrated circuit wherein a top projection of the semiconductor package forms an outline,
wherein the flexible piece is provided on and attached to the mold of the semiconductor package, an attachment area between the flexible piece and the semiconductor package being smaller than or equal to the outline of the semiconductor package, the flexible piece being arranged for receiving a force stimulus, so that upon exerting a force on the flexible piece, deformation of the flexible piece provides displacement of the target piece with respect to the sensing element that can be sensed by the sensing element.

2. The sensor of claim 1 wherein the semiconductor package comprises a surface facing away from the integrated circuit and wherein the flexible piece is deposited or adhered to the surface of the semiconductor package.

3. The sensor of claim 1 wherein the semiconductor package has a planar shape with a lateral projection with lower area than a top projection of the semiconductor package.

4. The sensor of claim 1, wherein the flexible piece is attached to that semiconductor package without extending beyond the top projection.

5. The sensor of claim 1 wherein the sensing element is a Hall effect-based position sensing element and the target piece is a magnetic target piece.

6. The sensor of claim 1 wherein the sensing element is an inductive sensing element and the target piece is a conductive target piece.

7. The sensor of claim 1 wherein the target piece is a metallic sheet embedded in or provided on the flexible piece.

8. The sensor of claim 1 wherein the target piece is a rigid target piece with less flexibility than the flexible piece so that the force stimulus on the target piece deforms the flexible piece.

9. The sensor of claim 1 wherein the target piece has a predetermined shape with a largest dimension in the top projection, the semiconductor package has a largest dimension in the top projection, and wherein a ratio between said dimension of the semiconductor package and said dimension of the target piece is 1.5 or larger.

10. The sensor of claim 1, wherein the sensing element is provided between the integrated circuit and the target piece.

11. The sensor of claim 1 wherein the sensing element is adjacent to the integrated circuit.

12. The sensor of claim 1 wherein the sensing element is integrated in the integrated circuit.

13. A sensor assembly comprising the force sensor of claim 1 wherein the integrated circuit is further adapted to provide readout signals based on the processed signals from the sensing element, further comprising a support structure, wherein the force sensor is provided on the support structure including connections for rerouting readout signals generated in the force sensor to an external output.

* * * * *